United States Patent [19]

Rice

[11] Patent Number: 4,514,023

[45] Date of Patent: Apr. 30, 1985

[54] INTEGRATED CIRCUIT PACKAGE CONNECTOR

[75] Inventor: Rex Rice, Menlo Park, Calif.

[73] Assignee: Burroughs Corporation, Detroit, Mich.

[21] Appl. No.: 552,605

[22] Filed: Jan. 16, 1984

Related U.S. Application Data

[63] Continuation of Ser. No. 343,258, Jan. 27, 1982, abandoned.

[51] Int. Cl.³ .................................... H01R 23/72
[52] U.S. Cl. ........................... 339/17 CF; 339/174
[58] Field of Search ............ 339/17 CF, 174, 258 R, 339/258 P, 176 M, 176 MP

[56] References Cited

U.S. PATENT DOCUMENTS 3,409,861 11/1968 Barnes et al. .................. 339/174
4,268,102 5/1981 Grabbe .......................... 339/17 CF

*Primary Examiner*—Neil Abrams
*Attorney, Agent, or Firm*—Charles J. Fassbender; Kevin R. Peterson

[57] ABSTRACT

Disclosed is an electrical conductor for use in an electro-mechanical connector of the type which holds an integrated circuit package and connects the package to an electrical system in a replaceable fashion. The electrical conductor is comprised of an elongated piece of material having a U-shaped bend to provide two legs; one of the legs also has a bend of approximately 90° in a first direction at a predetermined distance from said U-shaped bend to thereafter provide a first leg portion for pushing against and making ohmic contact with a corresponding lead in said integrated circuit package; and the other leg also has a bend of approximately 90° in the first direction at another predetermined distance from the U-shaped bend, and another bend of approximately 90° further along its length in a direction perpendicular to the first direction to thereafter provide a second leg portion for making ohmic contact with said electrical system. In this conductor, the respective lengths of the legs between the U-shaped bend and the bends of approximately 90° control the force vs. deflection characteristics by which the first leg portion pushes against the corresponding lead, and the length of the first leg portion of the one leg controls the maximum bending stress in the conductor.

12 Claims, 12 Drawing Figures $$y = \frac{F}{3EI}\left\{ L_a^3 + L_b^3 + \frac{L_a^2}{3}(L_b + \pi R) + \frac{L_a}{3}(4R^2 - L_b^2) + \frac{\pi R^3}{6} \right\}$$

eg. A $t = 0.0142"$
$w = 0.025"$ $S = \frac{FL_T}{I}\left(\frac{t}{2}\right)$ $R = 0.020"$ $L_b = 0.080"$
$L_a = 0.100"$
$L_T = 0.120"$

FIG.6A.

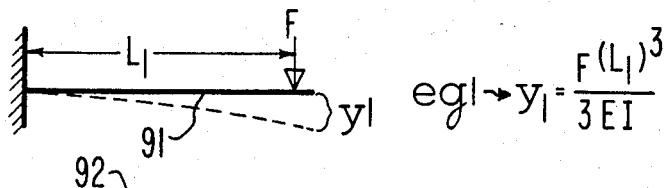

$$eq1 \rightarrow y_1 = \frac{F(L_1)^3}{3EI}$$

FIG.6B.

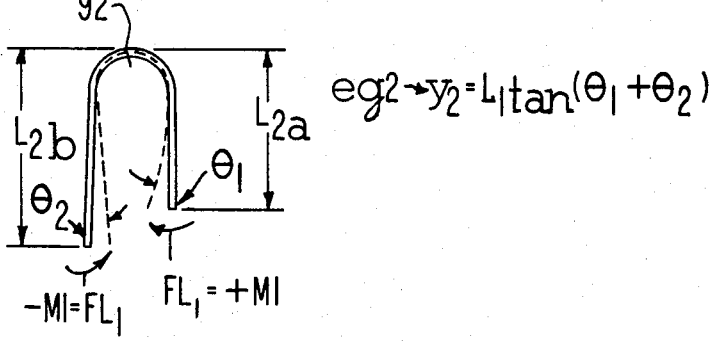

$$eq2 \rightarrow y_2 = L_1 \tan(\theta_1 + \theta_2)$$

FIG.6C.

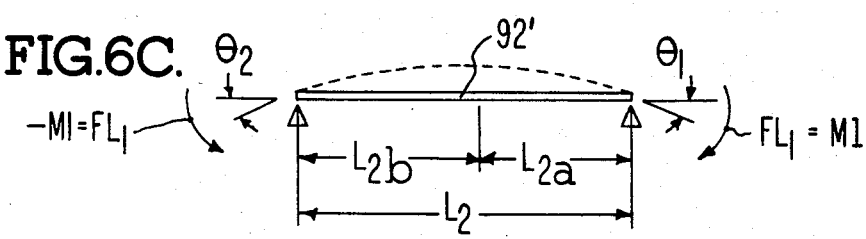

FIG.6D.

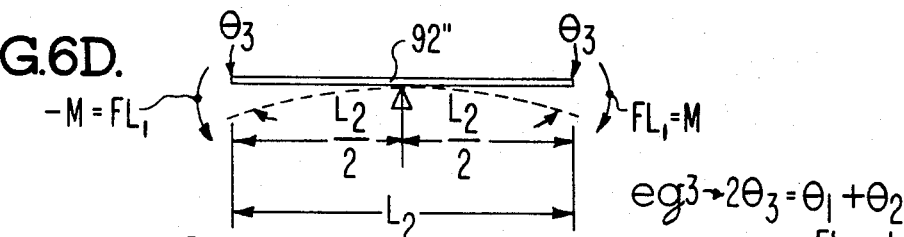

$$eq3 \rightarrow 2\theta_3 = \theta_1 + \theta_2$$

FIG.6E.

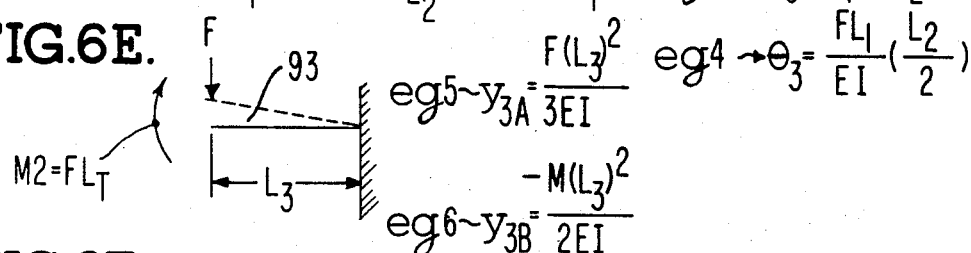

$$eq4 \rightarrow \theta_3 = \frac{FL_1}{EI}\left(\frac{L_2}{2}\right)$$

$$eq5 \rightarrow y_{3A} = \frac{F(L_3)^2}{3EI}$$

$$eq6 \rightarrow y_{3B} = \frac{-M(L_3)^2}{2EI}$$

FIG.6F.

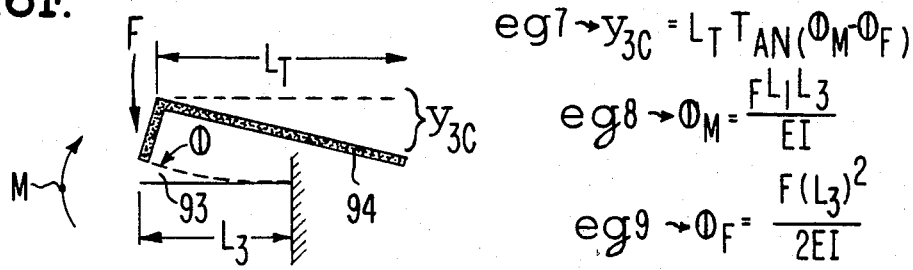

$$eq7 \rightarrow y_{3C} = L_T \tan(\Phi_M - \Phi_F)$$

$$eq8 \rightarrow \Phi_M = \frac{FL_1 L_3}{EI}$$

$$eq9 \rightarrow \Phi_F = \frac{F(L_3)^2}{2EI}$$

INTEGRATED CIRCUIT PACKAGE CONNECTOR

This is a continuation of application Ser. No. 343,258, filed Jan. 27, 1982, now abandoned.

BACKGROUND OF THE INVENTION

This invention relates to electro-mechanical connectors for connecting an integrated circuit package to an electronic system in a replaceable fashion; and more particularly, it relates to electrical conductors for use in the above electro-mechanical connectors.

One exemplary electro-mechanical connector of the type to which this invention relates is illustrated in FIG. 1. This particular connector is indicated by reference numeral 10; and in general, it includes a frame 20, a lid 40, and pivotal members 50-1 and 50-2.

Frame 20 is rectangular and has sides 21, 22, 23, and 24. These sides have L-shaped cross sections which define two concentric openings 25 and 26. Opening 25 aligns with the outer perimeter of an integrated circuit package 30; and opening 26 aligns with the outer perimeter of the leads 31 that extend from that package.

Included in each of the sides 21 through 24 are a plurality of electrical conductors 27. The total number of these conductors can vary from connector to connector; and one exemplary total number is sixty-eight (68). One portion 27a of each of the conductors 27 protrudes from the bottom of frame 20 to provide a means for making electrical contact with the electronic system (not shown). Another portion 27b of each of the conductors 27 protrudes through the top of frame 20 and makes electrical contact with corresponding conductors 31 in the integrated circuit package 30. It is the shape of conductor portion 27b to which this invention particularly relates.

Leads 31 in the integrated circuit package 30 connect to an integrated circuit chip 32. Those leads 31 are held in place by a material 33 such as plastic or ceramic. Portions 31a of the leads 31 extend from this material 33; and when package 30 is inserted into opening 25, those portions 31a of the leads 31 align and make electrical contact with corresponding conductor portions 27b in frame 20.

Lid 40, which is also included in connector 10, has hour sides 41, 42, 43, and 44. Those sides have an inner perimeter which coincides with opening 25 of frame 20, and have an outer perimeter which coincides with opening 26 of frame 30. Thus, lid 40 is shaped to lie on top of the lead portions 31a and press them against the corresponding conductor portions 27b in frame 20.

Pivotal members 50-1 and 50-2 provide a means for pressing lead portions 31a and conductor portions 27b together. Each pivotal member has a C-shaped latch portion 51 which consists of a central bar 51a and a pair of ends 51b. Bar 51a fits in fulcrums 45 on top of lid 40; and the ends 51b fit into respective tracks 28 on frame sides 22 and 24.

Each of the pivotal members 50-1 and 50-2 also include a lever portion 52. In operation, after bar 51a is placed in fulcrums 45, a force is manually applied to the lever portions 52. This force causes bar 51 to pivot in the fulcrums 45, causes the ends 51b of the two pivotal members to move in their respective tracks 28, and consequently causes the components 20, 30, and 40 to be pressed together and locked in place.

Consider now in greater detail the shape of the electrical conductors 27 as they are typically made in the prior art. That shape of one of the conductors 27 is illustrated in FIG. 2. As there illustrated, conductor 27 includes a curved member 61 and three straight legs 62, 63, and 64. Member 61 forms an arc of about 160°; and it has two ends 61a and 61b. End 61a is joined to one of the ends of leg 62, and end 61b is joined to one of the ends of leg 63.

Leg 63 lies on its side on the top surface of frame 20; while the curved member 61 along with leg 62 lie in a plane that is perpendicular to the top surface of frame 20. Leg 64 also lies perpendicular to the top and bottom surfaces of frame 20; and it protrudes through those surfaces to join leg 63 at an angle of approximately 90°. Leg 64 also extends beyond the bottom surface of frame 20 to provide a means for making electrical contact with an electronic system (which is not shown).

When the integrated circuit package 30 is locked within the electro-mechanical connector as described above, one of the leads 31 from integrated circuit package 30 pushes against the open end of leg 62. The force that lead 31 exerts against the open end of leg 62 is herein notated as force F; and this force is in a direction perpendicular to and toward the top surface of frame 20. In response to this force F, the open end of leg 62 deflects by a distance y toward the top surface of frame 20.

The distance y by which the open end of the leg 62 deflects may be expressed mathematically as equation A in FIG. 2. In equation A, length $L_a$ is the length of leg 62 as projected into the horizontal plane; length $L_b$ is the length of leg 63; R is the radius of the curved member 61; E is the modulus elasticity of the material from which components 61–64 are made; and I is the moment of inertia of the cross-sectional area of those components 61–64.

As leg 62 is deflected in response to force F in the manner described above, various stresses are generated in legs 62 and 63 and curved member 61. And the largest of these stresses occurs on the surfaces of member 61 at a distance $L_T$ away from the point of member 62 where the force F is applied. This maximum stress is herein notated as S and it can be expressed mathematically as equation B in FIG. 2. In this equation, t is the thickness of conductor 27, $L_T$ is $L_a$ plus R, and all of the other terms are as defined above.

FIG. 3 is a plot of the above equation A for deflection y vs. force F. In that figure, a curve 71 gives the deflection y for conductor 27 under the condition where leg 62 is relatively short; and a curve 72 gives the deflection y in conductor 27 under the condition where leg 62 is relatively long. Also in FIG. 3, the maximum stress S that occurs in the relatively short and relatively long conductors 27 in indicated for the condition where the force F is 200 grams.

More specifically, curve 71 corresponds to conductor 27 having a length $L_a$ of 0.100 inches a length $L_b$ of 0.080 inches, a radius R of 0.020 inches, a thickness t of 0.0142 inches, a width w of 0.025 inches, and a modulus of elasticity of $18.5 \times 10^6$ psi which is the modulus of elasticity for the copper alloy 725. Curve 72, by comparison, corresponds to conductor 27 having those same physical dimensions with the exception that length $L_a$ equals 0.240 inches and length $L_b$ equals 0.170 inches.

To help visualize the deflection and stress depicted by curve 71, the drawing of conductor 27 in FIG. 2 is scaled to those dimensions which correspond to curve 71. Similarly, the drawing of conductor 27 in FIG. 4 is scaled to those dimensions which correspond to curve 72. Also in FIGS. 2 and 4, a dashed line 27' indicates the manner in which conductor 27 deflects.

However, the distance by which conductor 27 actually deflects in connector 10 cannot be specified by a single number. Instead, that distance can only be specified to be within a certain desired deflection range. For example, in FIG. 3, the desired deflection range for conductor 27 is specified by reference numeral 73 as being from 0.025 inches to 0.045 inches.

In other words, after all of the components 20, 30, and 40 are locked in place, the deflection y of conductor 27 will be somewhere between 0.025 inches and 0.045 inches. This range occurs due to various manufacturing tolerances in the dimensions of the parts of connector 10; and it is also due to manufacturing tolerances in the thickness of the integrated circuit package leads 31.

Suppose now that conductor 27 is deflected by the minimal distance in range 73. When that occurs, one constraint which must be met is that the force F needs to be larger than some minimal force which will insure a reliable electrical connection between conductor 27 and the corresponding lead 31a. In FIG. 3, this minimal force is indicated by reference numeral 74 as being 100 grams.

Conversely, suppose that conductor 27 is deflected by the maximum distance in range 73. When that occurs, one other constraint which must be met is that maximum stress in conductor 27 cannot exceed the yield point stress. The yield point stress is the minimum stress which causes conductor 27 to permanently deform.

Also, another constraint which must be met is that the maximum force F times the total number of conductors in package 10 must not be larger than the force that an average person can reasonably be expected to exert with his fingers. Otherwise, all of the components 20, 30, and 40 could not be pressed together and locked in place. This maximum force per conductor is indicated in FIg. 3 as being 200 grams; and that force times sixty-eight (68) conductors is approximately 25 pounds.

Inspection of curves 71 and 72 shows that neither of the corresponding conductors 27 meets the above constraints. In particular, the conductor 27 corresponding to curve 71 is deficient in that the maximum allowable force F of 200 grams will be exceeded when the conductor is deflected by even less than the minimal distance of 0.025 inches. In other words, the conductor 27 that corresponds to curve 71 is "too stiff".

This "stiffness" is decreased by increasing the length $L_a$ of leg 62 as indicated by curve 72. For that curve, the force F corresponding to the maximum deflection distance of 0.045 inches is approximately 170 grams. However, increasing the length $L_a$ of leg 62 also has several undesirable effects.

One of those undesirable effects is that the maximum bending stress S in conductor 27 increases. For example, the maximum bending stress for the conductor 27 that corresponds to curve 72 is calculated from the above recited equation B for S as being equal to 137,210 psi. By comparison, the maximum bending stress S for the conductor 27 corresponding to curve 71 is only 62,844 psi. Thus, it is apparent that increasing length $L_a$ of leg 62 can result in the yield point stress being exceeded.

Also, another problem that results from increasing the length $L_a$ of leg 62 is that the bottom surface area of the connector frame 20 increases. This is evident from FIGS. 2 and 3. In FIG. 2, the distance $L_T$ is only 0.12 inches; while in FIG. 4 the distance $L_T$ is 0.26 inches. This penalty for increasing $L_T$ is paid four times, once on each side of the connector. Consequently, the number of connectors 10 that can be mounted side by side in a given area is greatly decreased.

BRIEF SUMMARY OF THE INVENTION

Accordingly, a primary object of the invention is to provide an improved electro-mechanical connector for connecting an integrated circuit package in an electronic system in a replaceable fashion.

Another more specific objective of the invention is to provide a conductor for use in an electro-mechanical connector having improved force vs. deflection and stress vs. deflection characteristics for any given length dimension $L_T$.

These and other objects are provided by an electro-mechanical connector comprising a frame having a plurality of electrical conductors mounted therein; the frame is shaped to hold an integrated circuit package such that the electrical conductors in the frame align with corresponding leads in the integrated circuit package; each electrical conductor in the frame includes an elongated piece of material having a U-shaped bend to provide two legs; one of the legs also has a bend of approximately 90° in a first direction at a predetermined distance from the U-shaped bend to thereafter provide a first leg portion for pushing against and making ohmic contact with a corresponding lead in said integrated circuit package; the other leg also has a bend of approximately 90° in the first direction at another predetermined distance from the U-shaped bend and has another bend of approximately 90° further along its length in a direction perpendicular to the first direction to thereafter provide a second leg portion for making ohmic contact with said electrical system; wherein the respective lengths of the legs between the U-shaped bend and the bends of approximately 90° control the force vs. deflection characteristics by which the first leg portion pushes against the corresponding lead, and the length of the first leg portion of the one leg controls the maximum bending stress in the conductor.

BRIEF DESCRIPTION OF THE DRAWINGS

Various features and advantages of the invention are described in the following Detailed Description in conjunction with the accompanying drawings wherein.

FIS. 6A, 6B, 6C, 6D, 6E, and 6F are schematic diagrams and equations which give a mathematical analysis of the operation of the FIG. 5 conductor.

DETAILED DESCRIPTION OF THE INVENTION

Figure 5:
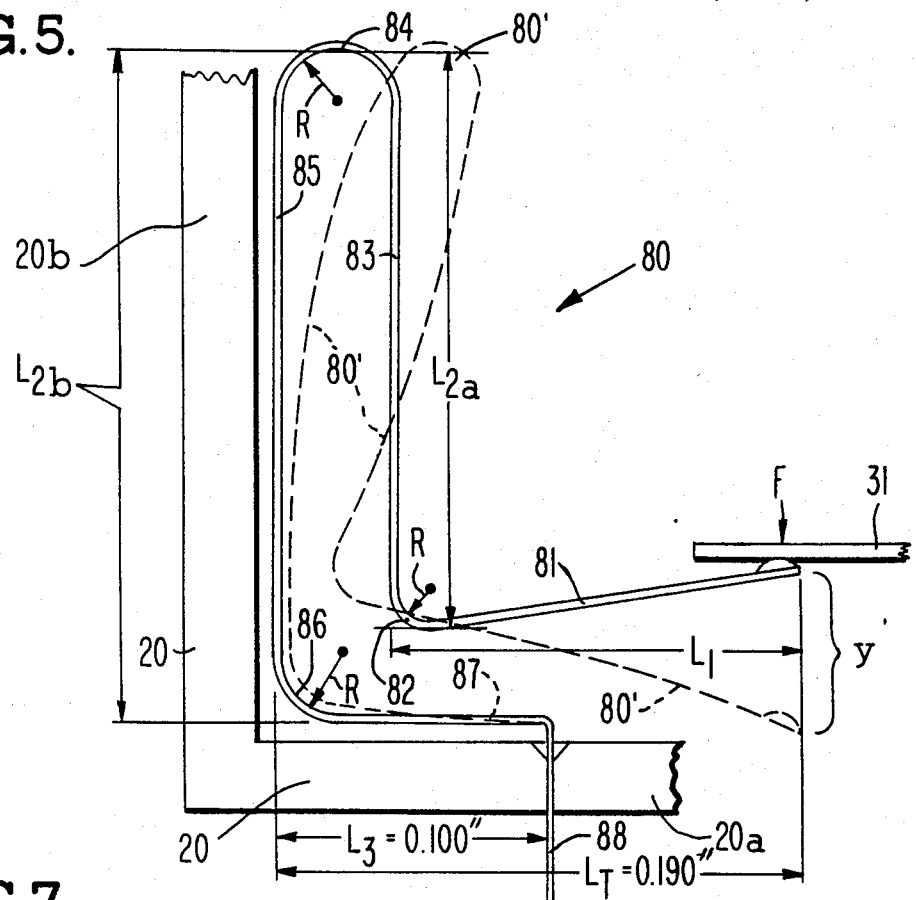
FIG. 5 is a scaled cross-sectional view of one preferred embodiment of a conductor constructed according to the invention.

Referring now to FIGS. 5, 6A–6F, and 7, the structure and operation of one preferred embodiment of a conductor constructed according to the invention will be described. This embodiment is indicated in FIG. 5 by reference numeral 80; and in operation it is incorporated into any electro-mechanical connector of the type that secures an integrated circuit package in a replaceable fashion to an electronic system. For example, it replaces the conductors 27 in the previously described connector 10 of FIG. 1.

Figures 1, 2:
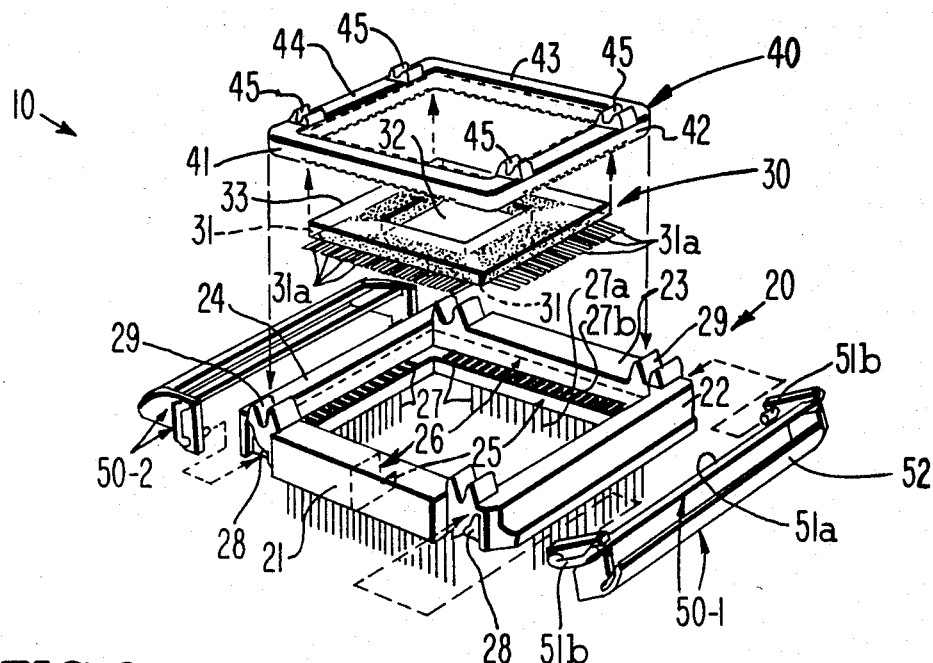
FIG. 1 is an exploded pictorial view of an electro-mechanical connector which can incorporate conductors constructed according to the prior art or, alternatively, can incorporate conductors constructed according to the invention.
FIGS. 2 and 4 are scaled cross-sectional views of prior art conductors for use in the connector of FIG. 1.

Conductor 80 consists of five straight legs and three curved sections which are all joined together in an end-to-end fashion to form a "gooseneck" shape. In FIG. 1, the five straight legs are identified by reference numerals 81, 83, 85, 87, and 88; and the curved sections are identified by reference numerals 82, 84, and 86.

One end of leg 81 joins to one end of the curved section 82; the other end of the curved section 82 joins to one end of leg 83; the other end of leg 83 joins to one end of the curved section 84; the other end of section 84 joins to one end of leg 85; the other end of leg 85 joins to one end of section 86; the other end of section 86 joins to one end of leg 87; and the other end of leg 87 joins directly to one end of leg 88.

Each of the curved sections 82, 84, and 86 forms an arc of radius R. Section 82 forms an arc of appropximately 80°; section 84 forms an arc of approximately 180°; section 86 forms an arc of approximately 90°; and legs 87 and 88 are joined together to form an angle of approximately 90°.

Preferably, all of these components 81–88 in conductor 80 are joined as a single integrated structure. This is achieved by stamping conductor 80 with the above-described shape from a flat sheet of material. Alternatively, this is achieved by bending a rectangular strip of material into the above-described shape, with the material having a grain that follows the respective directions of the bends.

When the connector 80 is mounted in the frame of an electro-mechanical connector, all of the components 81 through 88 lie in a plane perpendicular to the frame's bottom surface. Leg 88 protrudes through the connector frame; and a portion of leg 88 extends beyond the connector's bottom surface to provide a means for interconnecting the conductor 80 to an electronic system. Components 81 through 87 overlie the top surface of the connector's frame; and the open end of the leg 81 provides the means for making electrical contact with a lead 31 from the integrated circuit package.

When the integrated circuit package is locked in place in the electro-mechanical connector, lead 31 pushes against the open end of leg 81 with a force F. Consequently, conductor 80 bends as indicated by a dashed line 80' in FIG. 5; and the open end of leg 81 deflects by a distance y. This distance y is mathematically expressed by equations 1–8 of FIGS. 6A–6F.

As the dashed line 80' shows, all of the components 81 through 87 bend to contribute to the deflection distance y. And that portion of the deflection distance y which is due to the bending of components 81 and 82 is analyzed in FIG. 6A; that portion of the deflection distance y which is due to the bending of components 82, 83, 84, 85, and 86 is analyzed in FIGS. 6B–6D; and that portion of the deflection distance y which is due to the bending of components 86 and 87 is analyzed in FIGS. 6E–6F.

Consider now in greater detail the analysis of FIG. 6A. That figure includes a schematic diagram of a cantilevered beam 91 of a length $L_1$ having a force F applied to its open end. Beam 91 represents components 81 and 82 in conductor 80; and $L_1$ is the length of those two components as projected into a horizontal plane. Such a plane is parallel to the base 20a of the connector 20. In response to the force F, the open end of beam 91 deflects by a distance $y_1$; and this distance $y_1$ is expressed mathematically as equation 1 in FIG. 6A.

Next, consider the analysis of FIGS. 6B–6D. FIG. 6B is a schematic diagram of a U-shaped beam 92 having one leg of length $L_{2a}$ and having another leg of length $L_{2b}$. Length $L_{2a}$ is the length of components 82, 83, and 84 as projected onto a vertical plane; whereas length $L_{2b}$ is the length of components 84, 85, and 86 as projected onto a vertical plane.

A bending moment $+M1$ having a magnitude of $F \times L_1$ is applied to the open end of the leg of length $L_{2a}$. This bending moment is due to force F that is applied to the open end of component 81 in conductor 80. Moment $+M1$ is resisted by another bending moment $-M1$ of equal magnitude but of opposite direction that is applied to the open end of the leg of length $L_{2b}$. Note that for the sake of simplicity, this analysis ignores the short distance between components 83 and 85.

In response to bending moment $-M1$, the open end of the leg of beam 92 which is of length $L_{2a}$ deflects by an angle $\theta_1$. Similarly, in response to bending moment $-M1$, the open end of the leg of beam 92 which is of length $L_{2b}$ deflects by an angle $\theta_2$. Angles $\theta_1$ and $\theta_2$ are then added to get the angle by which member 81 rotates due to the bending of the components represented by beam 92. In turn, the distance $y_{2A}$ by which the open end of beam 81 is deflected due to this angular rotation is expressed in terms of $\theta_1$ and $\theta_2$ by equation 2.

What remains then is to calculate the angles $\theta_1$ and $\theta_2$. To that end, reference is made to FIG. 6C which is a schematic diagram of a straight beam 92' that is pinned at its ends and has moments of $+M1$ and $-M1$ applied to those pinned ends. Beam 92' is of length $L_2$ which equals $L_{2a}$ plus $L_{2b}$; and for the purposes of deflection analysis, beam 92' behaves the same as the above-described beam 92. In other words, the end of beam 92' having moment $+M1$ applied to it will rotate by the angle $\theta_1$; and the end of beam 92' having moment $-M1$ applied to it will rotate by the angle $\theta_2$.

Beam 92' of FIG. 6C may be redrawn, for our deflection analysis purposes, as beam 92'' of FIG. 6D. Beam 92'' is of length $L_2$ and has moments of $+M1$ and $-M1$ applies to its ends; however, it differs from beam 92' in that its ends are not pinned. Instead, beam 92'' rests on a fulcrum that is placed at its center. Each of the ends of beam 92'' thus rotates by the same angle $\theta_3$, and angle $\theta_3$ is related to the angles $\Theta_1$ and $\theta_2$ by equation 3 in FIG. 6D. Angle $\theta_3$ may then be expressed mathematically by standard beam deflection formulas as given by equation 4 in FIG. 6D.

Next, consider the analysis of FIGS. 6E–6F. FIG. 6F includes a schematic diagram of a cantilevered beam 93 having a length $L_3$ which is the length of members 86 and 87 of conductor 80 as projected into the horizontal plane. Force F is applied to the open end of beam 93; and a moment M2 equal to $F \times L_T$ is also applied to the open end of that beam.

In response to the force F, the open end of beam 93 deflects by a distance $y_{3A}$. The distance $y_{3A}$ is expressed mathematically by equation 5. Also, in response to the moment M2, the open end of beam 93 deflects by a distance $y_{3B}$. Distance $y_{3B}$ is expressed mathematically by equation 6.

However, force F and moment M deflect beam 93 in opposite directions. And the direction which force F deflects beam 93 is the same as the above-described deflections $y_1$ and $y_2$. Consequently, the distance $y_{3B}$ by which moment M deflects beam 93 is preceded by a minus sign.

When the open end of beam 93 deflects by the above-described distances $y_{3A}$ and $y_{3B}$, the open end also rotates by an angle $\phi$. This is illustrated in FIG. 6D. And a hypothetical rigid member 94, which represents components 81–85 of conductor 80, attaches to that end of beam 93 and rotates with it by the angle $\phi$.

Due to this rotation, member 94 moves in the vertical plane by a distance $y_{3C}$. And this distance $y_{3C}$ is expressed mathematically in terms of length $L_3$ and the angle $\phi$ by equation 7 in FIG. 6F. One term $\phi_{M2}$ in equation 7 represents that portion of the angle $\phi$ which is due to the moment M2; and another term $\phi_F$ represents that portion of the angle $\phi$ which is due to the force F. Equation 8 in FIG. 6F then gives a mathematical expression for the term $\phi_{M2}$; and equation 9 gives the mathematical expression for the term $\phi_F$.

In summary, the total deflection distance y of the open end of conductor 80 can be expressed mathematically as the summation of the above-defined terms $y_1$, $y_2$, $y_{3A}$, $y_{3B}$, and $y_{3C}$. This is stated by equation 10 in FIG. 7. Equation 10 may then be utilized to study the deflection vs. force characteristics of conductor 80 and to compare them to the prior art.

Figure 7:
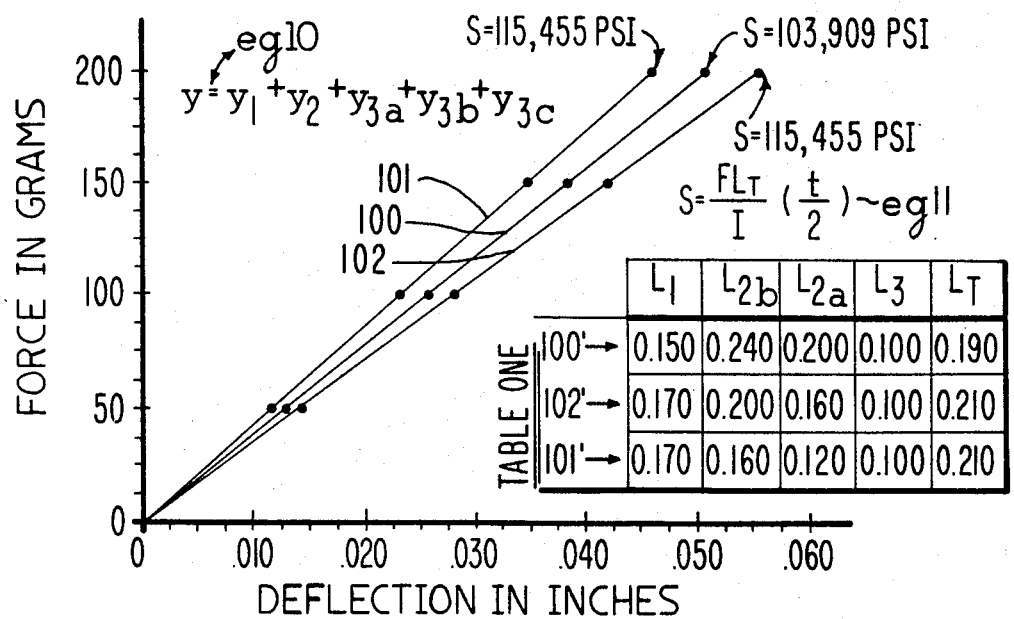
FIG. 7 is a set of curves illustrating the deflection vs. force characteristics and deflection vs. stress characteristics of the FIG. 5 conductor.

FIG. 7 contains a set of curves 100, 101, and 102 which plot the deflection vs. force characteristic for conductor 80; and the physical dimensions of the conductor 80 which correspond to those curves 100–102 are given in Table 1. More specifically, row 100′ gives the physical dimensions of conductor 80 which correspond to curve 100; row 101′ gives the physical dimensions of conductor 80 which correspond to curve 101; and row 102′ gives the physical dimensions of conductor 80 which correspond to curve 102.

Compare now curves 100–102 and the physical dimensions of the corresponding conductors 80 in rows 100′–102′ with curve 72 and the physical dimensions of the prior art conductor 27. Firstly, note that all of the conductors 80 which correspond to curves 100, 101, and 102 meet the minimum allowable force constraint 74 and maximum allowable force constraint 75 for the previously defined deflection range 73. That is, all of the conductors 80 which correspond to curves 100, 101, and 102 exert a force on lead 31 of approximately 100 grams when they are deflected by the minimal distance of 0.025 inches; and they exert a force of approximately 200 grams when they are deflected by the maximum distance of 0.045 inches.

Figure 3:
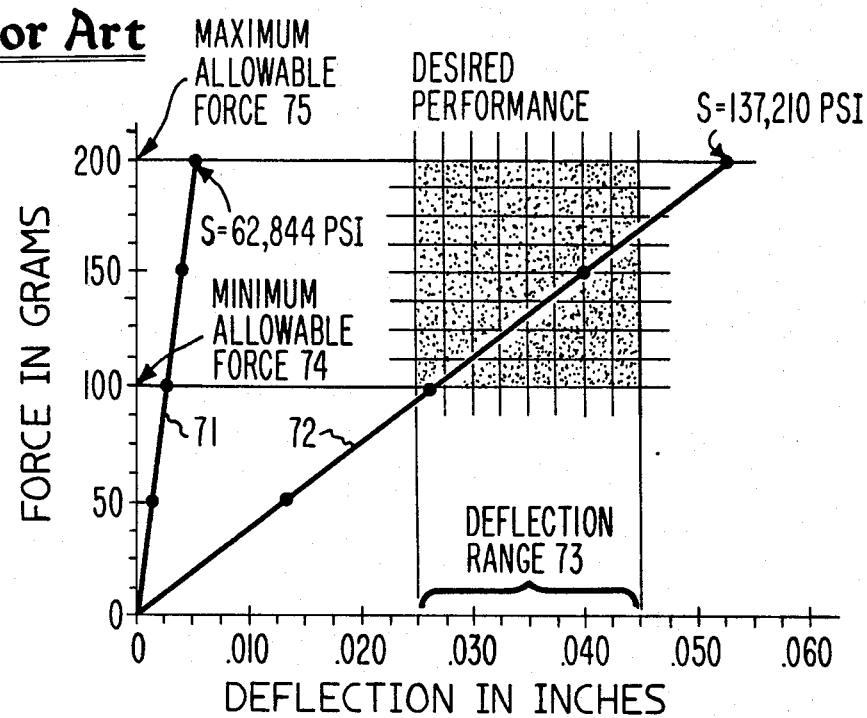
FIG. 3 is a set of curves illustrating the deflection vs. force characteristics and deflection vs. stress characteristics of the prior art conductor of FIGS. 2 and 4.

Next, compare the maximum stress S that occurs in the conductors 80 that corresponds to curves 100, 101, and 102 with the maximum stress S that occurs in the prior art conductor 27. That prior art conductor 27 has a maximum stress S of 132,210 psi as illustrated by curve 72 in FIG. 3. But by comparison, the maximum stress S in the conductors 80 that corresponds to curves 100, 101, and 102 respectively is 103,909 psi and 115,455 psi, and 115,455 psi, as illustrated in FIG. 7. This maximum stress S in conductor 80 occurs in the outer surfaces of leg 85 and it is expressed mathematically as $S=(FL_T/I)(t/2)$.

Figure 4:
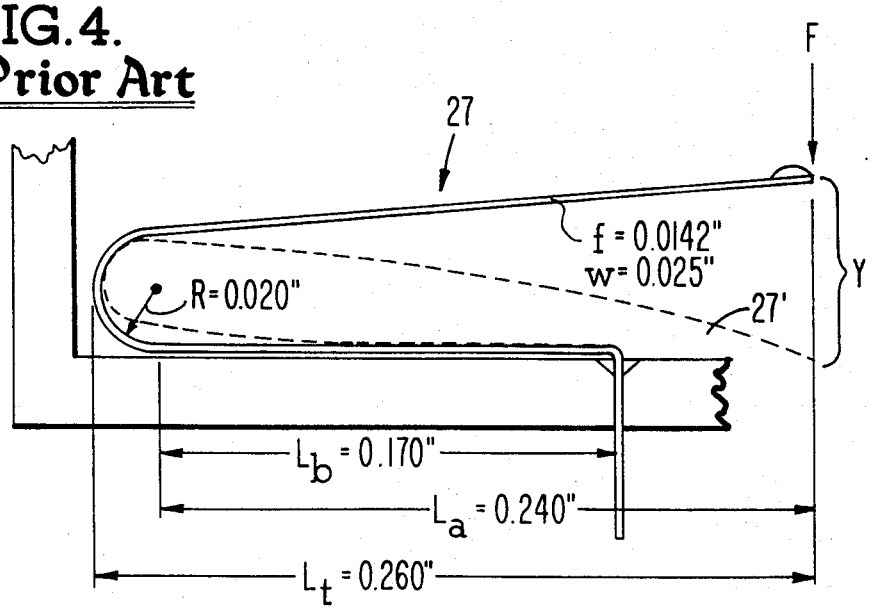

Further, note that the physical dimension $L_T$ of the conductors 80 which correspond to curves 100, 101, and 102 respectively are 0.190 inches, 0.210 inches, and 0.210 inches; whereas that same physical dimension $L_T$ of the prior art conductor 27 of FIG. 4 is 0.260 inches. Thus, the electro-mechanical connector 10 which incorporates conductor 80 will have a smaller bottom surface area than a connector 10 which incorporates conductor 27.

In summary then, table 1 and curves 100, 101, and 102 clearly show the superiority of conductor 80 over conductor 27. This superiority is due to the fact that conductor 80 is able to meet a given force vs. deflection characteristic as defined by the manufacturing tolerances of an electro-mechanical connector while at the same time have a smaller physical dimension $L_t$ and sustain less stress S than conductors of the prior art. By adjusting the dimension $L_T$, the constraint on maximum bending stress S can be meet; and by adjusting lengths $L_{2a}$ and $L_{2b}$, the constraints on deflection vs. force can also be met for any conductor of a given thickness, width, and modulus of elasticity.

Equation 10 of FIG. 7 states that the deflection y is proportional to a term "$y_1$" and a term "$y_2$". Term "$y_1$" is given by equation 1 in FIG. 6A as $y_1=F(L_1)^3/3EI$; and term "$y_2$" is given by equation 2 in FIG. 6B. Note that the equation for $y_2$ includes the sum $\theta_1+\theta_2$. That sum is expressed in terms of $\theta_3$ by equation 3 of FIG. 6D. Also, $\theta_3$ is expressed in terms of $L_2$ by equation 4 of FIG. 6E; and $L_2$ is equal to $L_{2a}+L_{2b}$ as is clearly shown by FIG. 6C. Thus, by simple algebraic substitution, equation 2 can be written as $y_2=(1/3EI)F(L_1)^3+L_1\tan[(1/EI)FL_1(L_{2a}+L_{2b})]$.

Clearly, in the equation for $y_1$, the factor "1/3EI" is a constant. Since E is the modulus of elasticity of the material from which the components are made and I is the amount of inertia of the cross-sectional area of the components. Thus the factor 1/3EI can be represented in simplified form as a constant $k_2$.

Also, in the equation for $y_2$, the factor 1/EI is a constant; and in equation 11 of FIG. 7, the term t/I2 is a constant. These factors can also be rewritten in simplified form as constants $k_3$ and $k_1$ respectively.

One preferred embodiment of the invention has now been described in detail. In addition, however, various changes and modifications can be made to this embodiment without departing from the nature and spirit of the invention. For example, in the preferred embodiment of FIG. 5, sections 82, 84, and 86 form respective arcs of 80°, 180°, and 90°. But these arcs can also be varied somewhat, such as ±10°, without departing from the spirit of the invention. Also, in the above analysis which compared equations A and B of FIG. 2 with equations 10 and 11 of FIG. 7, the cross sections of conductors 27 and 80 were assumed to be rectangular. But similar results occur when the cross sections of those conductors are assumed to be circular. Also, the above analysis assumes the conductors 27 and 80 have uniform cross sections along their length. But similar results can again be obtained when the cross sections of any corresponding members of the conductors 27 and 80 are assumed to be tapered. Accordingly, since many such modifications and changes can be made, it is to be understood that the invention is not limited to said details but is defined by the appended claims.

What is claimed is:

1. An electro-mechanical connector for connecting an integrated circuit package to an electronic system in a replaceable fashion; said connector including a frame having a plurality of electrical conductors mounted therein; and said frame being shaped to hold said integrated circuit package such that each electrical conductor of said plurality aligns with a corresponding lead in said integrated circuit package; wherein:

each electrical conductor is comprised of an elongated planar piece of material having four bends respectively at lengths $L_1$, $L_{2a}$, $L_{2b}$ and $L_3$ along said conductor which make the maximum bending stress S in said conductor equal to $S=k_1F(L_1)$ and independently make the distance y by which said conductor deflects as said conductor pushes against said corresponding lead proportional to $y=k_2F(L_1)^3+L_1 \tan[k_3FL_1(L_{2a}+L_{2b})]$ where F is the force by which said conductor pushes and $k_1$, $k_2$, and $k_3$ are constants;

said lengths $L_1$, $L_{2a}$, $L_{2b}$ and $L_3$ being straight and of the same order of magnitude;

a first one of said bends being a U-shaped bend which provides two legs;

one of said legs having a second one of said bends of approximately 90° in a first direction at length $L_{2a}$ from said U-shaped bend to thereafter provide a straight first leg portion of length $L_1$ for pushing against and making ohmic contact with a corresponding lead in said integrated circuit package;

the other of said legs having a third one of said bends of approximately 90° in said first direction at length $L_{2b}$ from said U-shaped bend which is longer than said length $L_{2a}$, and having a fourth one of said bends of approximately 90° at length $L_3$ further along its length in a direction perpendicular to said first direction to thereafter provide a second leg portion for making ohmic contact with said electrical system.

2. An electro-mechanical connector according to claim 1 wherein each electrical conductor of said plurality has a uniform cross section throughout its length.

3. An electro-mechanical connector according to claim 2 wherein said uniform cross section is rectangular.

4. An electro-mechanical connector according to claim 2 wherein said uniform cross section is circular.

5. An electro-mechanical connector according to claim 1 wherein said first leg portion of said one leg has a tapered cross section in each electrical conductor of said plurality.

6. An electro-mechanical connector according to claim 1 wherein each electrical conductor of said plurality is made of a metal having a grain that follows the respective directions of said bends.

7. An electrical conductor for use in an electro-mechanical connector of the type which holds an integrated circuit package and connects said package to an electrical system in a replaceable fashion; said electrical conductor being comprised of:

an elongated planar piece of material having first, second, third, and fourth bends consecutively at lengths $L_1$, $L_{2a}$, $L_{2b}$ and $L_3$ along the conductor which are selected to make the maximum bending stress S in said conductor equal to $S=k_3F(L_1)$ and independently control the force F vs. deflection y characteristics of said conductor by making said deflection proportional to $y=K_2F(L_1)^3+L_1 \tan[k_3FL_1(L_{2a}+L_{2b})]$ where $k_1$, $k_2$ and $k_3$ are constants; wherein, said lengths $L_1$, $L_{2a}$, $L_{2b}$ and $L_3$ are straight and are of the same order of magnitude;

said first bend is a 90° angle at said length $L_1$ from an end of the conductor to provide a leg for bending by said deflection y while pushing with said force F against a corresponding lead in said integrated circuit package to make ohmic contact thereto;

said second bend is a 180° angle at said length $L_{2a}$ from said first bend;

said third bend is a 90° angle in the direction of said leg at said length $L_{2b}$ from said second bend, length $L_{2b}$ being slightly longer than length $L_{2a}$; and said fourth bend is a 90° angle perpendicular to said leg at length $L_3$ from said third bend to thereafter provide another leg for making ohmic contact with said electrical system.

8. An electrical conductor according to claim 7 and which is further characterized as having a uniform cross section throughout its length.

9. An electrical conductor according to claim 8 wherein said uniform cross section is rectangular.

10. An electrical conductor according to claim 8 wherein said uniform cross section is circular.

11. An electrical conductor according to claim 7 wherein said first leg portion of said one leg has a tapered cross section.

12. An electrical conductor according to claim 7 and which is further characterized as being made of a metal having a grain that follows the respective directions of said bends.

* * * * *